United States Patent
St. Clair

(10) Patent No.: US 11,868,305 B2
(45) Date of Patent: Jan. 9, 2024

(54) NONLINEAR, DECENTRALIZED PROCESSING UNIT AND RELATED SYSTEMS OR METHODOLOGIES

(71) Applicant: SIMULI, INC., La Jolla, CA (US)

(72) Inventor: Rachel St. Clair, S. Delray Beach, FL (US)

(*) Notice: Subject to any disclaimer, the term of this patent is extended or adjusted under 35 U.S.C. 154(b) by 0 days.

(21) Appl. No.: 17/979,573

(22) Filed: Nov. 2, 2022

(65) Prior Publication Data

US 2023/0342328 A1    Oct. 26, 2023

Related U.S. Application Data

(63) Continuation-in-part of application No. 17/728,864, filed on Apr. 25, 2022, now Pat. No. 11,569,842.

(51) Int. Cl.
| | |
|---|---|
| *H03M 7/34* | (2006.01) |
| *G06F 15/78* | (2006.01) |
| *G06F 9/30* | (2018.01) |

(52) U.S. Cl.
CPC ...... *G06F 15/7814* (2013.01); *G06F 9/30036* (2013.01)

(58) Field of Classification Search
CPC ........... H03M 13/1515; H03M 7/6005; H03M 13/091; H03M 13/1108; H03M 13/13; H03M 13/1575; H03M 13/158; H03M 13/1595; H03M 13/19; H03M 13/2906; H03M 13/37; H03M 13/6561; H03M 13/6569; H03M 13/6588; H03M 7/24; H03M 7/3059; H03M 7/3064; H03M 7/3071; H03M 7/3082; H03M 7/6011

USPC .......................................... 341/51, 87, 88, 50
See application file for complete search history.

(56) References Cited

U.S. PATENT DOCUMENTS

| | | | | |
|---|---|---|---|---|
| 5,925,145 | A * | 7/1999 | Illes | G01R 31/31919 714/738 |
| 7,113,936 | B1 * | 9/2006 | Michel | H03M 7/30 |
| 9,722,632 | B2 * | 8/2017 | Anderson | H03M 13/1575 |
| 11,569,842 | B1 * | 1/2023 | St.Clair | H03M 7/40 |
| 2004/0117718 | A1 * | 6/2004 | Manasse | H03M 13/1515 714/781 |
| 2011/0276563 | A1 * | 11/2011 | Sandoval | H04L 63/102 707/723 |
| 2012/0183073 | A1 * | 7/2012 | Milstein | H04N 19/1887 375/240.19 |

(Continued)

*Primary Examiner* — Linh V Nguyen
(74) *Attorney, Agent, or Firm* — Bryce A. Johnson; John K. Buche; Buche & Associates, P.C.

(57) ABSTRACT

Disclosed is a processor chip that includes on-chip and off-chip software. The chip is optimized for hyperdimensional, fixed-point vector algebra to efficiently store, process, and retrieve information. A specialized on-chip data-embedding algorithm uses algebraic logic gates to convert off-chip normal data, such as images and spreadsheets, into discrete, abstract vector space where information is processed with off-chip software and on-chip accelerated computation via a desaturation method. Information is retrieved using an on-chip optimized decoding algorithm. Additional software provides an interface between a CPU and the processor chip to manage information processing instructions for efficient data transfer on- and off-chip in addition to providing intelligent processing that associates input information to allow for suggestive outputs.

15 Claims, 8 Drawing Sheets

(56) References Cited

U.S. PATENT DOCUMENTS

| | | | |
|---|---|---|---|
| 2013/0318351 A1* | 11/2013 | Hirano | H04L 9/3073 |
| | | | 713/168 |
| 2017/0366204 A1* | 12/2017 | Shi | H04L 25/061 |
| 2018/0084269 A1* | 3/2018 | Qiu | H04N 19/176 |
| 2019/0164262 A1* | 5/2019 | Cellier | G06T 5/009 |
| 2020/0401900 A1* | 12/2020 | Lee | G06N 3/04 |

* cited by examiner

NONLINEAR, DECENTRALIZED PROCESSING UNIT AND RELATED SYSTEMS OR METHODOLOGIES

CROSS-REFERENCE TO RELATED APPLICATIONS

Not applicable.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

REFERENCE TO AN APPENDIX SUBMITTED ON A COMPACT DISC AND INCORPORATED BY REFERENCE OF THE MATERIAL ON THE COMPACT DISC

Not applicable.

STATEMENT REGARDING PRIOR DISCLOSURES BY THE INVENTOR OR A JOINT INVENTOR

Reserved for a later date, if necessary.

BACKGROUND OF THE INVENTION

Field of Invention

The subject matter of this document is related to a system and method of large-scale information processing in computer systems. Specifically, this subject matter pertains to encoding, processing, and decoding information in such a way that intelligently processes information.

Background of the Invention

Information and intelligent data processing are commonly performed by a graphics processing unit ("GPU"), which separates information, or data, into vectors which are manipulated by arithmetic logic operators in parallel. GPUs have been widely adopted over central processing units ("CPUs") using parallel processing for the additional speed GPUs provide. While a CPU is more often used in large-scale computing, a GPU has the added benefit of processing more data at once, using fewer computational resources. However, in large-scale information processing, the GPU is not often used because it does not have on-board memory to store data, it requires vastly different software approaches to handling the information than what most data centers currently use, and its logic gates use arithmetic designed for floating point operations which are not always the type of operations needed in large-scale processing. In large-scale computing, the current approach is generally to employ the CPU with some specialized GPU processing. Because of this, in server computing applications where many CPUs and GPUs work together, such as cloud computing, computational cost concerns have become increasingly important as large-scale data processing usage continues to increase.

Furthermore, intelligent computing, such as artificial intelligence (AI")," is often computed on GPU hardware. In AI systems, the "intelligence" is simply algorithms that instruct the hardware to run computations; a GPU does not have intelligence to process information beyond its ability to run parallel processing and design specifications with fidelity. Essentially, a GPU is unable to process information intelligently without specific algorithms that instruct the GPU's logic gate structure to provide intelligent output. The GPU itself does not produce intelligent computation; an unoptimized code program could use a GPU with the same inefficiency as a CPU.

Emerging intelligent information processing systems use a similar methodology.

An intelligence processing unit ("IPU") is similar to a GPU, although the IPU's hardware is optimized specifically for backpropagation-like algorithms, such as those used for training neural networks. Neuromorphic computing is hardware optimized directly for an intelligent algorithm but is not generalized to perform large-scale non-intelligent information processing, such as data-sharding. Additionally, edge-computing is specifically designed for a particular input processing type with a specific desired output; the hardware has been optimized directly for a single task. These applications each have advantages and disadvantages in computational speed, memory, and power usage, although they need to rely on the hardware for directly implementing intelligent abilities and none are applicable to generic large-scale information processing that can adapt to different information input-output pipelines.

In large-scale data processing today, data-sharding is a common technique to leverage multiple computer resources to process a database that a single computer process alone could not handle. Data-sharding works by separating information vectors into multiple pieces of data that are then processed on multiple different hardware components, such as GPUs and CPUs, in parallel across computers and within each device. Although data-sharding is commonly used across many applications, it relies on adding more computational resources without reconsidering any mathematical principles currently employed by the hardware's logic gates.

Similarly, many AI programs often use backpropagation-based methods. In those backpropagation-based methods, parallel processing of GPU and IPU hardware computes and accelerates a gradient, because multiple partial derivatives can be computed for gradient optimization used during backpropagation in parallel. However, the gradient must be trained on specific input types, which incurs extra computational requirements as the need for new inputs increases over time. In other words, AI programs using backpropagation must rely more and more on parallel processing as the amount of information increases over time. Additional reliance on parallel processing continuously requires more hardware or time spent on the same hardware, either of which increases both computational cost and energy consumption, limiting the economic and environmental feasibility of long-term use.

Although some prior art in this area exists, it does not specifically address the issue at hand. Prior art that relates to the methodology and system disclosed in this application include mathematical approaches that leverage high-dimensional vector fields to mix information so information vectors can be computed in bulk. Jaeckel, U.S. Pat. No. 5,113,507, uses a similar fundamental mathematical theory to use high-dimensional computing for vectors to use "bind" and "bundle" operations to compute integrated information vectors. Although Jaeckel describes the programming methodology, it does not describe how the program can be adapted generically to large-scale computing to multiple input types in accelerated hardware that leverages advancements in logic gate operations and hardware designs. Overall, Jaeckel describes a system of addressing associative memory, rather than large-scale information storage, processing, and retrieval as disclosed by this invention.

In view of the foregoing, a need exists for a computer processing chip that utilizes advanced mathematics to intelligently encode information directly in hardware gates for large-scale, generic information processing at high speeds with relatively low energy consumption.

SUMMARY OF THE INVENTION

In view of the foregoing, an object of this specification is to disclose an apparatus and related methods for processing large datasets and information while enabling low-power consumption and generic information storage, processing, retrieval, and activation with intelligent suggestion and contextual reference. Embodiments of the disclosed devices enable users to store information with hardware optimized for low power consumption and computational speed by reducing computation time and memory. There are many approaches for leveraging the mathematical foundations of high-dimensional computing. Described below are several embodiments that enable appropriate approaches to allow multiple information processing procedures that can be optimized in current hardware architectures.

The underlying approach of high-dimensional computing is to encode vectors into large dimensional fields. Once the vectors are in a large dimensional field, they can be computed simultaneously in mixed form, rather than individually in parallel. Many techniques can be used to encode vectors into a large dimensional field. However, embodiments of this invention require use of a technique that embeds the data, regardless of type, into a large binary vector to be agnostic to the type of data being encoded. To embed the data, the embedding algorithm is used generally across all incoming data that is to be stored with the already stored data and is then converted into a large binary vector format. The methods of embedding are vast. It is important to optimize embedding for general applicability and for memory usage, speed, and data loss fidelity. Several low-level programming languages can convert the embedding algorithm into logic gates. The most common programming language is C, which directly compiles program instruction sets into hardware operation. The underlying mathematical logic for encoding natural information, including images, text, and numerical data, will have a large impact on downstream information processing modules. Therefore, the embodiment's embedding module plays a crucial role in later information processing and retrieval.

Once the information is encoded from the sensory capture unit, or CPU direction, the information needs to be processed so it can be manipulated according to the operator's instructions. These instructions dictate the type of processing needed, whether it be storage and retrieval, further mathematical manipulation, or intelligent processing pipelines. A relationship within the information being processed is created by a module, or sub-program. Furthermore, processed information has a structural and temporal relationship with other environmental information. For example, if a baseball is seen just before a baseball bat, the baseball and baseball bat likely have a meaningful representation in relation to the baseball. In standard information processing, a temporal relationship is difficult to capture without providing the software many examples of the two occurring in temporal succession. In intelligent information processing as described here, the two should be encoded and processed with some meaningful relationship upon first instance. This encoding can be directly optimized in hardware. Similarly, in data processing that does not require encoding relationships, the process of storing information in such a way that can be manipulated such that a meaningful output is returned, the original data must be preserved such that the original data is not lost. Information theory is used to minimize data loss when processing data that requires encoding relationships. Core processing algorithms can be written directly in the hardware which allows further processing to manipulate on-chip computations. Hardware optimization here relies on direct logic gate computations to create associations between data points and efficient encoding-retrieval schemes.

The encoded and processed data then needs to be retrieved off-chip for the rest of the hardware system to use it. This output must be decoded from the high-dimensional mathematical form. The decoding algorithm is directly tied to embedding and processing methods so that once the information is encoded and processed it cannot lose the original relationships in the dataset. Therefore, decoding needs to be lossless for pure information storage and retrieval and nearly lossless for most intelligent processing. In advanced intelligent information processing, some loss is accepted, such as when it occurs in biological intelligence, so that the system can process information related to some temporal dimension that allows suggestive information to be contextually driven and adaptable to novel information context.

In addition to information encoding, processing, and decoding, the underlying mathematics used in the embodiments creates a new challenge, referred to as desaturation. As information vectors become mixed, the value contained in each dimension increases. Traditionally, these values require increases in memory resources, which ultimately leads to increases in computational costs and carbon emissions. To account for this, and reduce computational resources, a desaturation method can be used to reduce the value in each of the vector's dimensions. Ultimately, this technique increases the system's longevity to perform intelligent information processing within resource constraints. In practice, desaturation can be performed in many ways and desaturation methods should be hardware-optimized for computational resource efficiency. When relying on computation methods that keep the numerical values in each dimension of the large vector low, after binding and bundling, the vector should release information for distant temporal events. Releasing information for distant temporal events incurs a recent temporal event information processing constraint. Further metrics enforce an "importance" metric that preserves informational relationships that are imperative to the dataset. As a standard, these desaturation computations should be optimized in hardware generically, largely independent of tasks and information input and output types.

From a high-level view, there are four important algorithms for optimizing information storage, processing, and retrieval: embedding, processing, desaturation, and retrieval. Ideally, the algorithms should occur in the above order when necessary. In one embodiment, the hardware can further optimize these algorithms not only in direct logic gate computation, but also in the data processing pipeline implementation. Computations, or algorithmic operations, can be performed in parallel. While parallelization is not a new technique, the idea of mixed information vector processing, or bulk parallel processing, combined with parallel implementation is novel.

Disclosed in this invention is the approach that takes a generic, data-type neutral embedding algorithm which transforms natural data, such as images, text, or numerical data, into a fixed-point, abstract vector space. An abstract vector uses mathematical computations that exceed field algebra. These abstract operations can be performed on information vectors that are combined into single vectors without losing information relationships and enable original data reconstruction when necessary. Therefore, this invention uses significantly less computational memory and power consumption when compared to existing architectures.

Essentially, the ideal flow of information processing in current architectures is to process information in vector format both independently and, when possible, in parallel. In the novel architecture disclosed, the information processing pipeline encodes information vectors into abstract high dimensional vector fields, where information can be processed either in bulk simultaneously and/or in parallel and retrieved either losslessly or with minimal loss depending on the amount of AI needed. In one embodiment, AI uses the hardware-optimized algorithms' suggestive properties directly to suggest pertinent information according to current context and data points' novel relationships, or information vectors, for later contextual inference. Data storage and retrieval is either lossless data encoding and retrieval or intelligent data encoding and retrieval. In lossless encoding and retrieval, data is encoded and retrieved so that the data's retrieval does not degrade the properties and relationships of the original dataset. The lossless process encodes, processes, and retrieves data where the data points' relationships can be exploited to provide additional contextual relationships. Data recovery and reconstruction are exactly what was encoded, meaning the original data is preserved entirely. In intelligent encoding and retrieval, some data loss occurs because of the extra processing computations that provide additional meaningful relationships between data points. Both information processing types are efficient in terms of computational energy used, speed, and memory in a manner that available hardware is unable to capture.

The present application discloses four novel mathematical algorithms to provide the disclosed embodiments' approaches to information processing. In doing so, the disclosed program is directly implemented in hardware. The result is an improved hardware architecture and code program that improves energy consumption, speed, and memory over available prior art. The disclosed embodiments reduce data-sharding and increase intelligent processing, such as AI, while drastically reducing the need for computational resources. The disclosed embodiments encode data simultaneously and in parallel while requiring significantly fewer computational resources (e.g., between one and ten (i.e. ten or less) hardware registers.

BRIEF DESCRIPTION OF THE SEVERAL VIEWS OF THE DRAWINGS

Other objectives of the disclosure will become apparent to those skilled in the art once the invention has been shown and described. The manner in which these objectives and other desirable characteristics can be obtained is explained in the following description and attached figures in which.

It is to be noted, however, that the appended figures illustrate only typical embodiments of this invention and are therefore not to be considered limiting of its scope, for the invention may admit to other equally effective embodiments that will be appreciated by those reasonably skilled in the relevant arts. Also, figures are not necessarily made to scale but are representative.

DETAILED DESCRIPTION OF PREFERRED EMBODIMENTS

Figure 1:
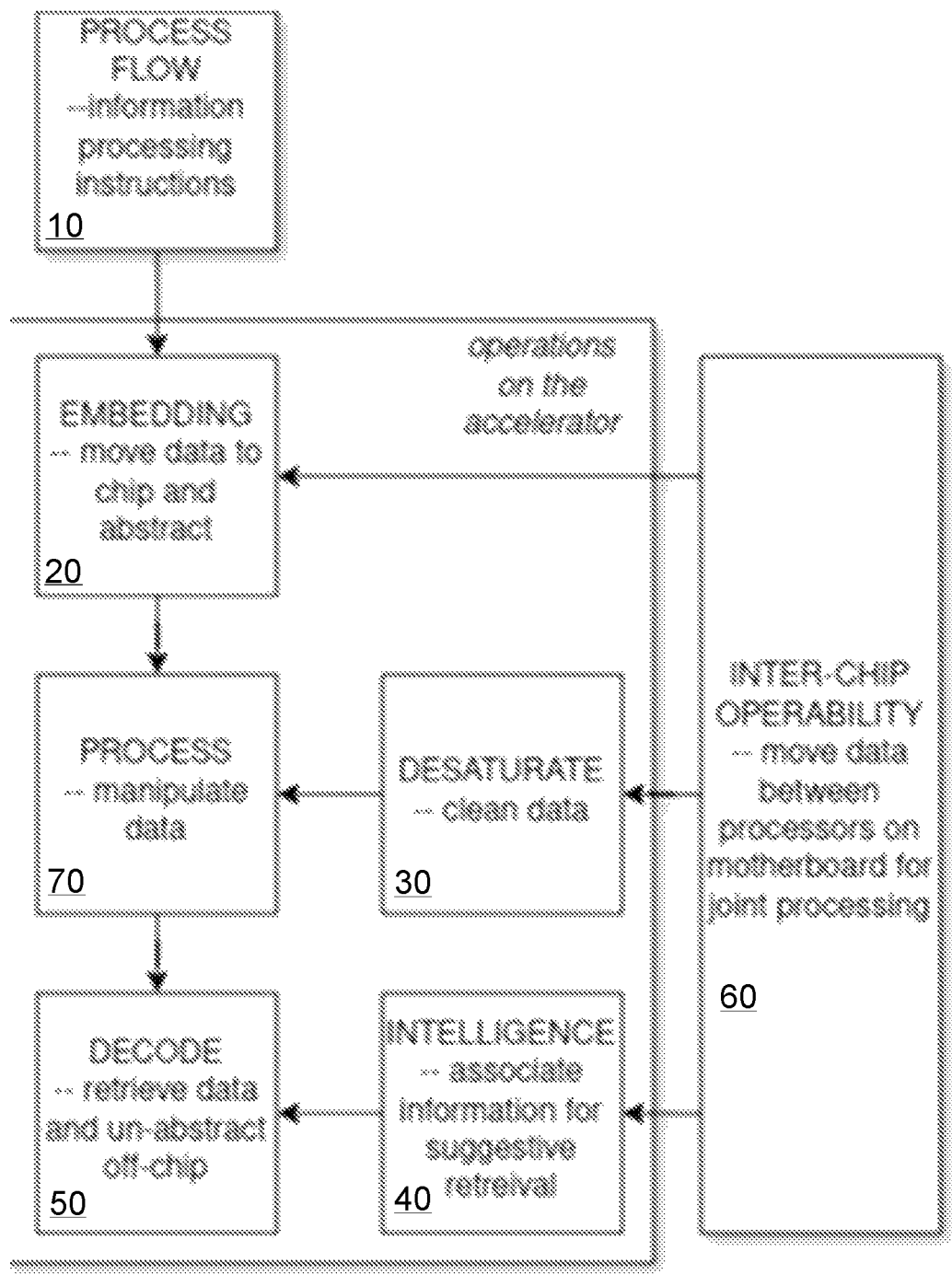
FIG. 1 depicts a flow diagram of information storage, processing, and retrieval as separated into software and hardware stages.

Disclosed is a processor chip and system for resource-conservative information processing with accelerated hardware using hyperdimensional, fixed-point vector algebra. The system uses the improved processor chip with a traditional computer system, including, but not limited to, input devices such as a mouse and keyboard; main memory; random access memory (RAM); additional processors; at least one motherboard; and a computer system software. FIG. 1 illustrates an information processing (10) flow as separated into software and hardware stages where information comes into the host computer via sensory captures or other storage locations on or off the host device. An on-chip embedding module (20) then moves data on-chip. Once the data is on-chip, a process module (70) manipulates the data according to information processing (40) instructions (41). If necessary, an on-chip desaturation (30) protocol can be employed. Once the data is processed, an on-chip decoding module (50) retrieves the data. If intelligent information processing (40) is specified by the process flow program, an intelligence module is employed in tandem with the decoding module. Data can be moved on-chip or off-chip during any point and can be shared between processors given an appropriate motherboard configuration. Each on-chip module can be run in parallel on multiple processing cores.

Figure 2:
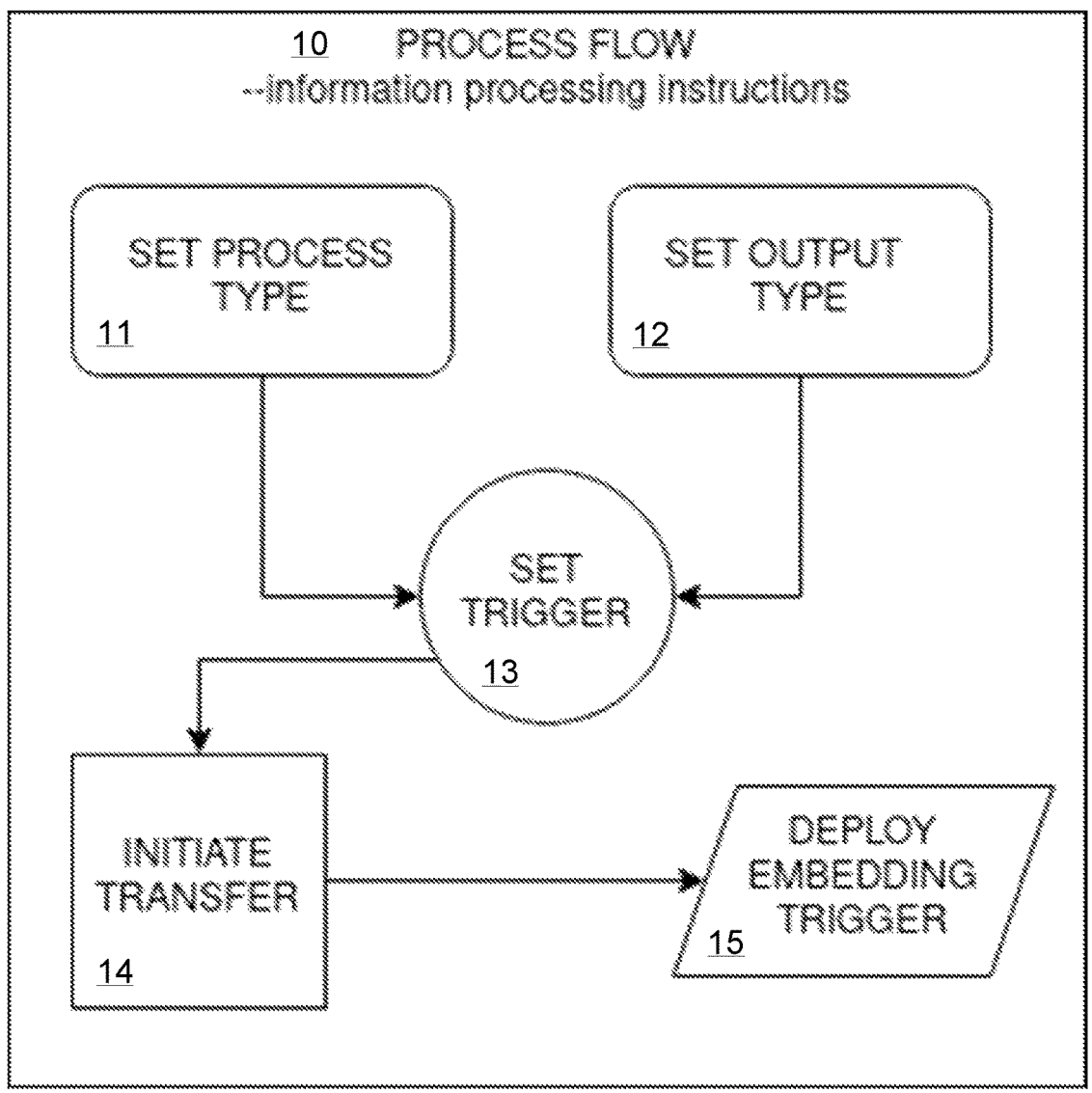
FIG. 2 depicts a flow diagram of information processing instructions to move information to a processor chip.

FIG. 2 illustrates a process flow module (10) which proves information processing instructions to move information to a preferred embodiment of a processor chip. FIG. 2 defines the process flow needed for desired output, where different outputs have different processing requirements (11). The processing requirements have different chip modes in a preferable embodiment of the on-chip software. The process flow module instructs a CPU to send the chip to an appropriate on-chip pipeline according to input/output triggers. Preferably, an instruction set is compiled into a host machine's CPU with the C programming language. The instruction set is a regular code file that provides an overall input to output (12) program to be computed. Preferably, a process type is set to include which data receives intelligent processing. The program can describe an output-type instance to determine specific encoding and decoding protocols to be performed in a decoding module. The process type and output type then set a trigger (13) to initiate an on-chip protocol. The on-chip protocol is a separate set of instructions that interfaces between the host process flow program and the chip, typically referred to as a chip's compiler driver. The driver then initiates a transfer (14) through direct memory access ("DMA"). The protocol then deploys an embedding trigger (15) to start the embedding (20) module.

Figure 3:
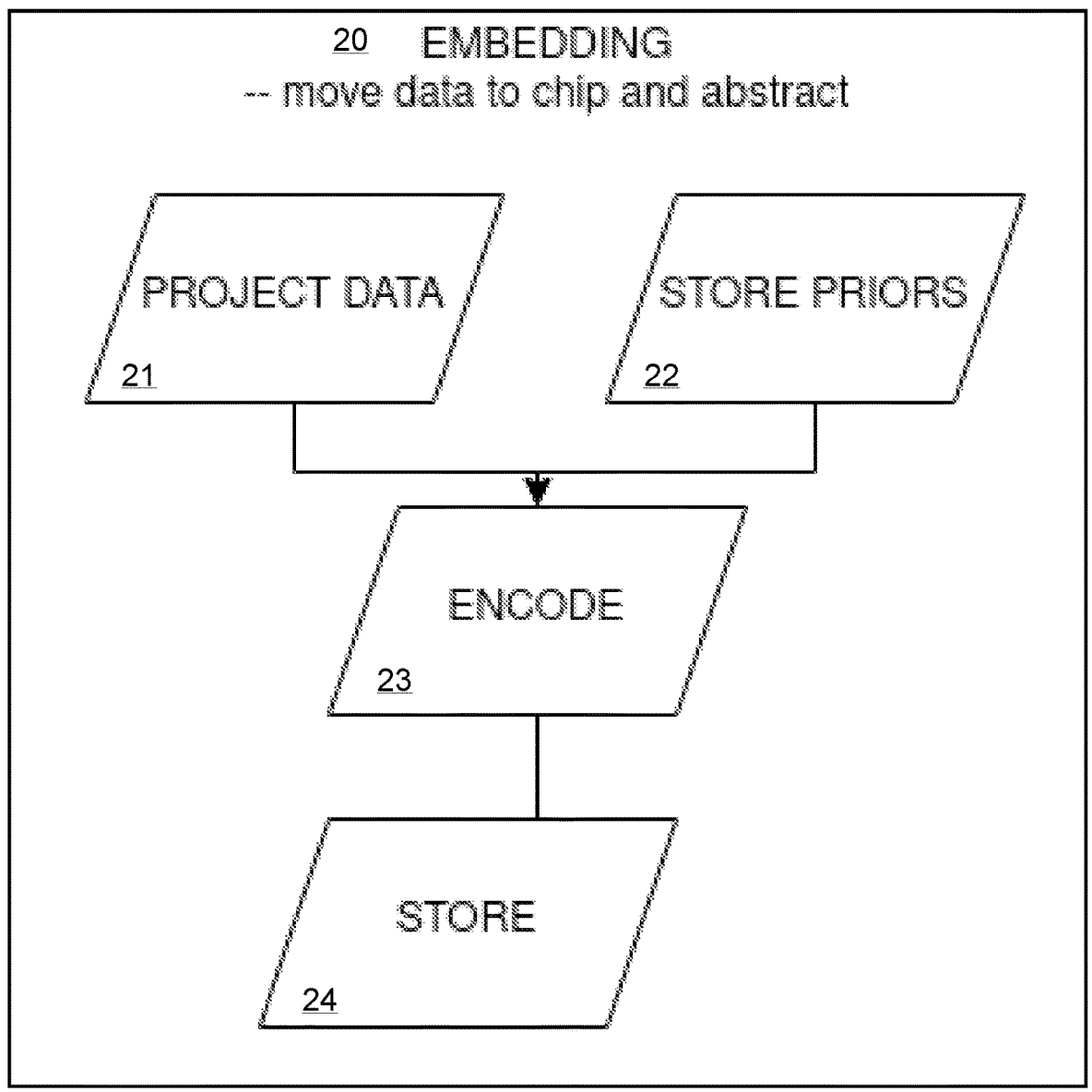
FIG. 3 depicts a flow diagram of information embedding, encoding, and storage on a processor chip.

FIG. 3 illustrates on-chip information embedding (20), on-chip encoding (23), and storage (24) on a preferable embodiment of a processor chip. The on-chip information embedding (20) module and process move bit data from another processor or primary or secondary memory source including, but not limited to, a CPU, storage, or RAM, to the processor chip. The data from the other memory source is the project data (21). In a preferred embodiment of the processor chip, the type of embedding mode is set based on the configuration of the information pipeline, although in alternate embodiments the embedding module may be variable depending on the information pipeline's configuration. Automatic on-chip software processing transforms off-chip data to on-chip data so that information is stored within the processor chip by employing directly optimized logic gates of the embedding function.

To complete the DMA, which moves data onto the chip, the on-chip embedding (20) module takes natural data and projects it into fixed-point vectors of 8192 dimensions. To compute the projection, a prior dictionary of permutations is calculated and stored in a kernel on the chip. Together the kernel and the on-chip information encoding (23) module use a projection algorithm to encode the data in parallel into the appropriate number of integer vectors, which is always less than the total number of natural information vectors. The projection uses a random number generator such that the fixed-point vectors are encrypted. Bundle and Bind operations are used to compress multiple fixed-point vectors into binary, or bit, vectors. A sorting algorithm is used in tandem with stored priors (22) to store (24) the resultant vectors so that encoded data is maximally distant in a high-dimensional vector space. The process occurs in several on-chip processors.

Figure 4:
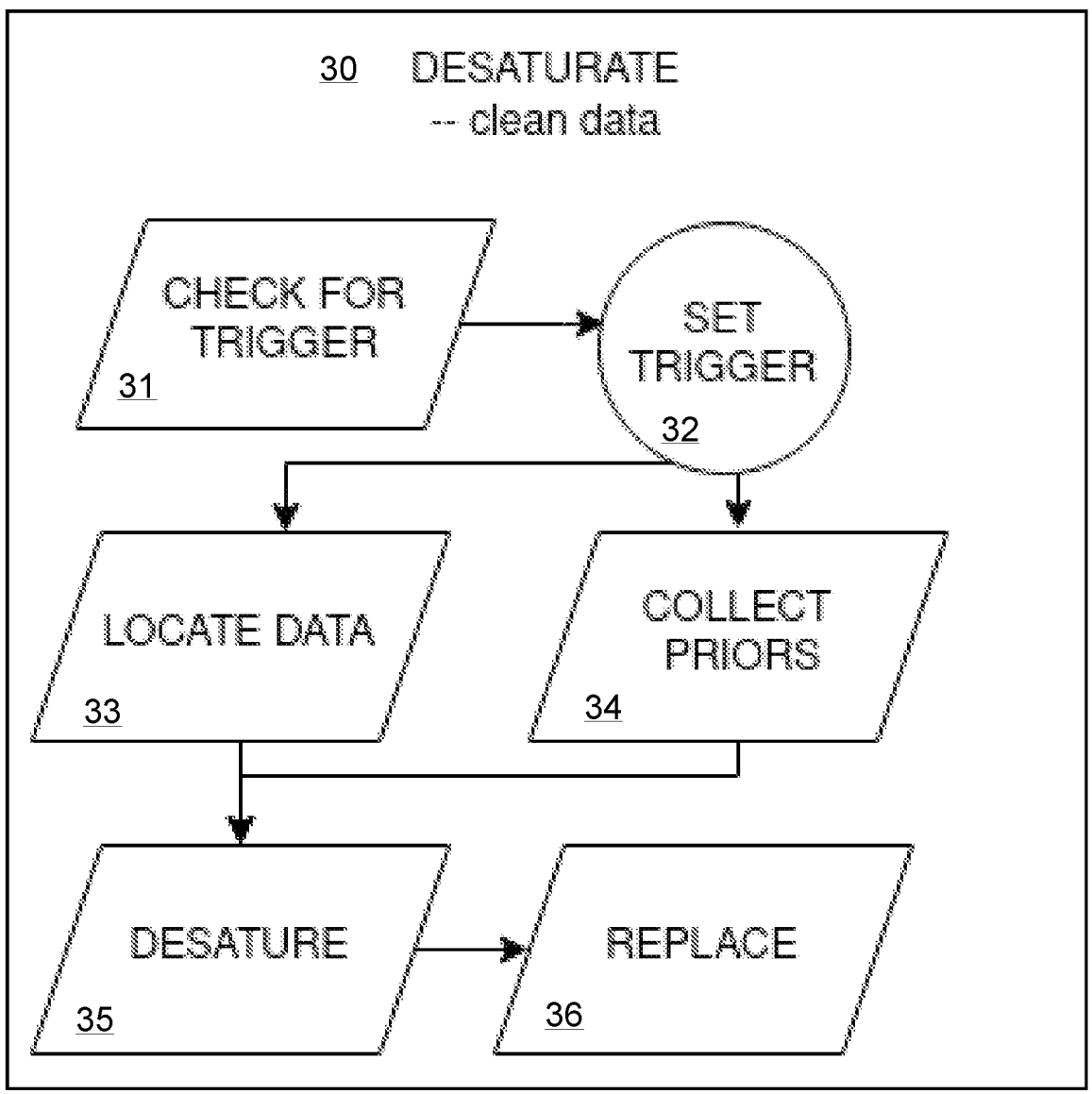
FIG. 4 depicts a flow diagram of an information desaturation process.

FIG. 4 illustrates an on-chip desaturation (30) module and an on-chip information desaturation process which cleans data to keep memory size low. In a preferable embodiment the process triggers (31) automatically during embedding and processing stages, although in alternative embodiments could trigger during different stages of chip processes. When the desaturation module automatically triggers (32) and deploys a separate on-chip kernel periodically checks global memory and cache for fixed-point vectors which exceed memory thresholds (33). The memory threshold checks occur when the number in each dimension has grown large enough that its conversion to binary representation exceeds a predefined percentage of a fixed-point vector's memory size. Once desaturation triggers, the appropriate stored priors are retrieved and the vector to be desaturated is located and pulled (34) into the desaturate memory cache. The desaturation algorithm then uses the priors as instructions for which dimensions to reduce (35) to a predetermined smaller state. The modified fixed-point vector is then sent back to storage to continue processing (36). The preferable embodiment of the desaturation module runs in parallel with other on-chip operations and can be deployed on multiple chips at once.

Figure 5:
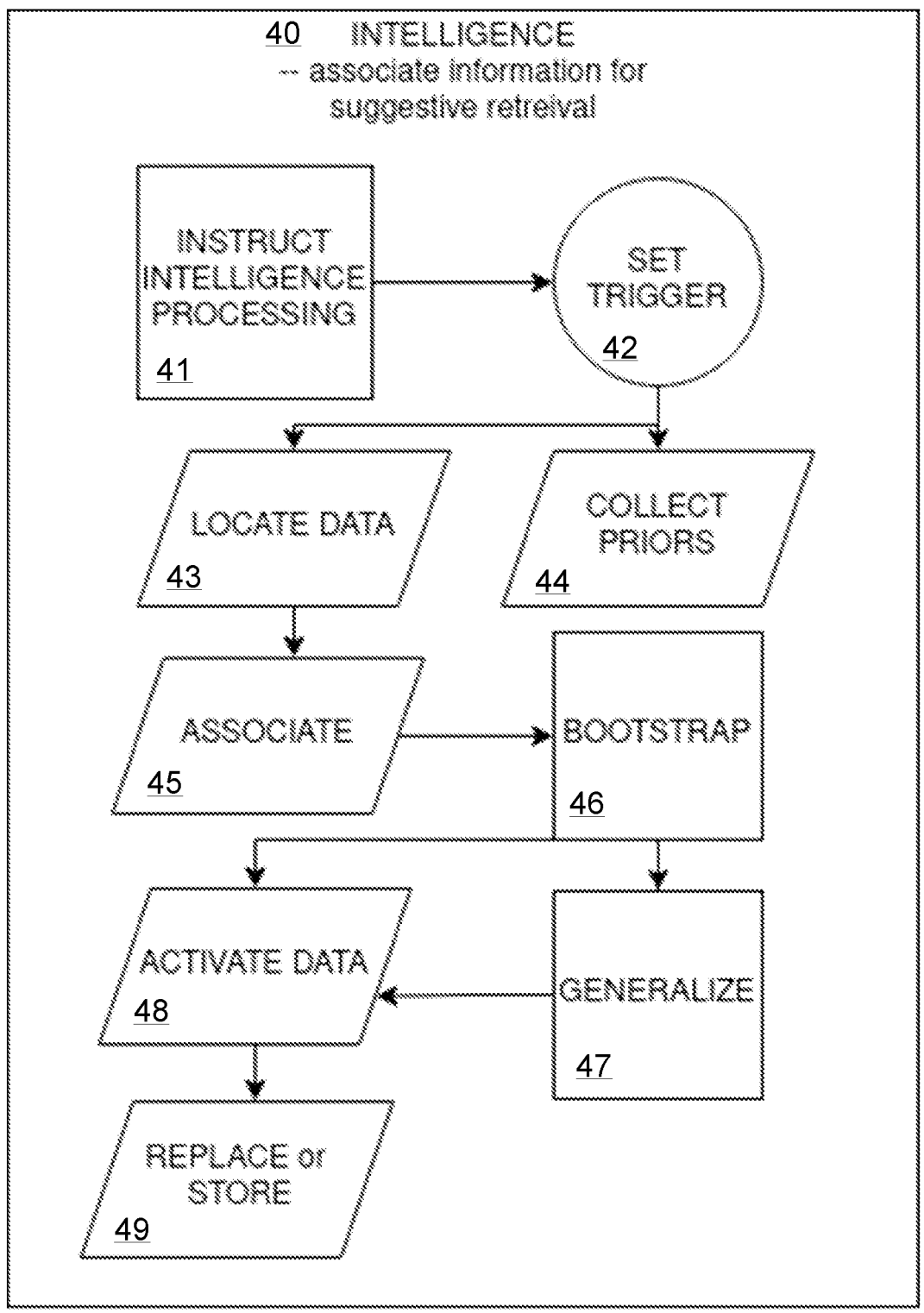
FIG. 5 depicts a flow diagram of an embodiment of intelligent processing software.

FIG. 5 illustrates a preferable embodiment of an intelligent processing (40) module and software that deploy according to a process flow program. The preferable embodiment of the process recruits a combination of on-chip and off-chip software and occurs during the encoding stage (23). The intelligent processing (40) software can afford on-chip association according to the processing module pipeline, with further off-chip instructions potentially manipulating on-chip data to provide methods for generalization and a-priori contextual suggestions (41).

A preferable embodiment of intelligent retrieval uses an information activation (48) software to extract special associative properties of fixed-point vectors using mathematical properties of the maximally distant fixed-point vectors (42). The association algorithm relies on logic operations directly encoded on-chip. The intelligence is built into the chip and only requires instructing the chip to initiate the built-in protocol to locate the necessary data (43). In alternate embodiments, other intelligent algorithms can be employed at this stage for further integrated processing features. When other intelligent algorithms are employed, advanced cognitive algorithms use specialized mathematics to monitor when information has been associated (45) together and store the record on-chip in the form of fixed-point vectors.

Depending on when the associations (45) are made, links between vectors (44) are established in a record. In a preferable embodiment, the record is then used to efficiently sequester vectors that should be active in global memory. Sequestering vectors allows suggestions to be made to complete subsets of data when only a partial subset of the data is available. The sequestering technique can be further extended by using off-chip algorithms to extend the bootstrapping (46) of contextual information in novel events. Additionally, the same records used for bootstrapping can also be used for generalization (47), where relationships between input and output are learned and then inferred. The learning and inferring works by the information activation software sequestering vectors that should be involved in the process flow instructions, so the instruction set must be modified less frequently over the information processing system's continual use. The new data is added to the information processing pipeline, where an input-output relationship can be inferred by a generalization algorithm instead of being directly hard-coded into the chip by host CPU instructions such as the information processing (10) instructions. In a preferred embodiment the next step is activating sequestered vectors (48) using an information activation software by pushing them to a global memory. The activation module is cyclical, so the record needs to be updated continuously. Intelligence modules can run in parallel on-chip kernels and use other motherboard processors to employ other intelligence algorithms. Near the end of the intelligent retrieval processes, some intelligent processing may manipulate the data directly, which then replaces or becomes stored (49) in the appropriate module's global memory.

Figure 6:
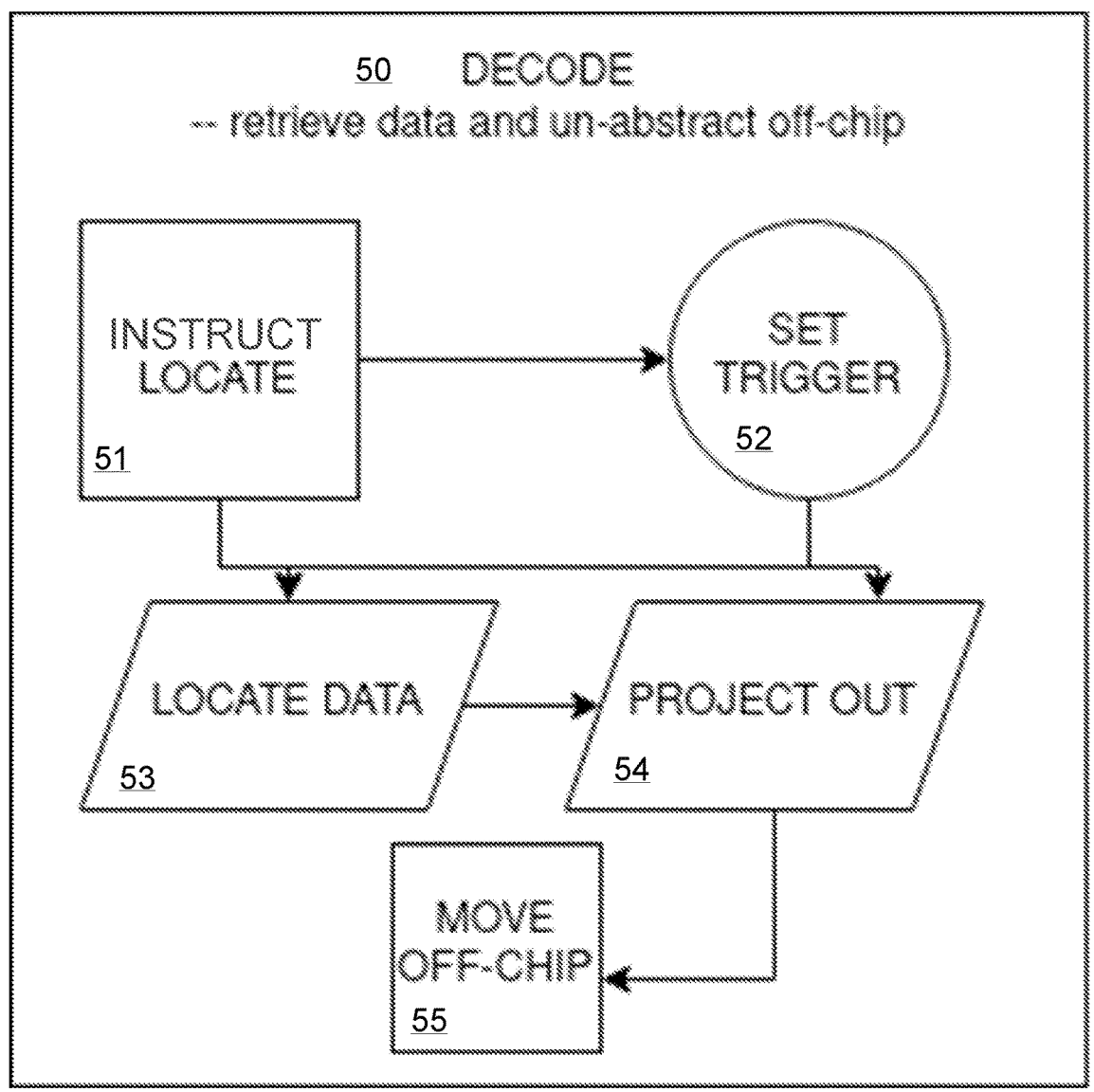
FIG. 6 depicts a flow diagram of an on-chip decoding software.

FIG. 6 illustrates an on-chip decoding (50) software and decoding (50) module where information vectors are projected back to their original form or desired output form and moved off-chip by CPU instructions. Data that has been requested (51) to be moved off-chip either by the process flow program, intelligence module, or inter-chip operability trigger the decoding module. The preferable first step in a decoding module is that the decoding software automatically selects data vectors to decode, where a trigger is set (52) to remove those vectors from the rest of the modules (53). After the selected vectors are pulled into a decoding module's memory cache, the data is projected out (54) of high dimensional vector space, using a decoding algorithm that reassembles the fixed-point vectors, into bit vectors of original data form. The decoding algorithm completes the off-chip DMA process (55). The decoding module has special logic gate operations directly encoded on-chip to accelerate the decoding algorithm.

Figure 7:
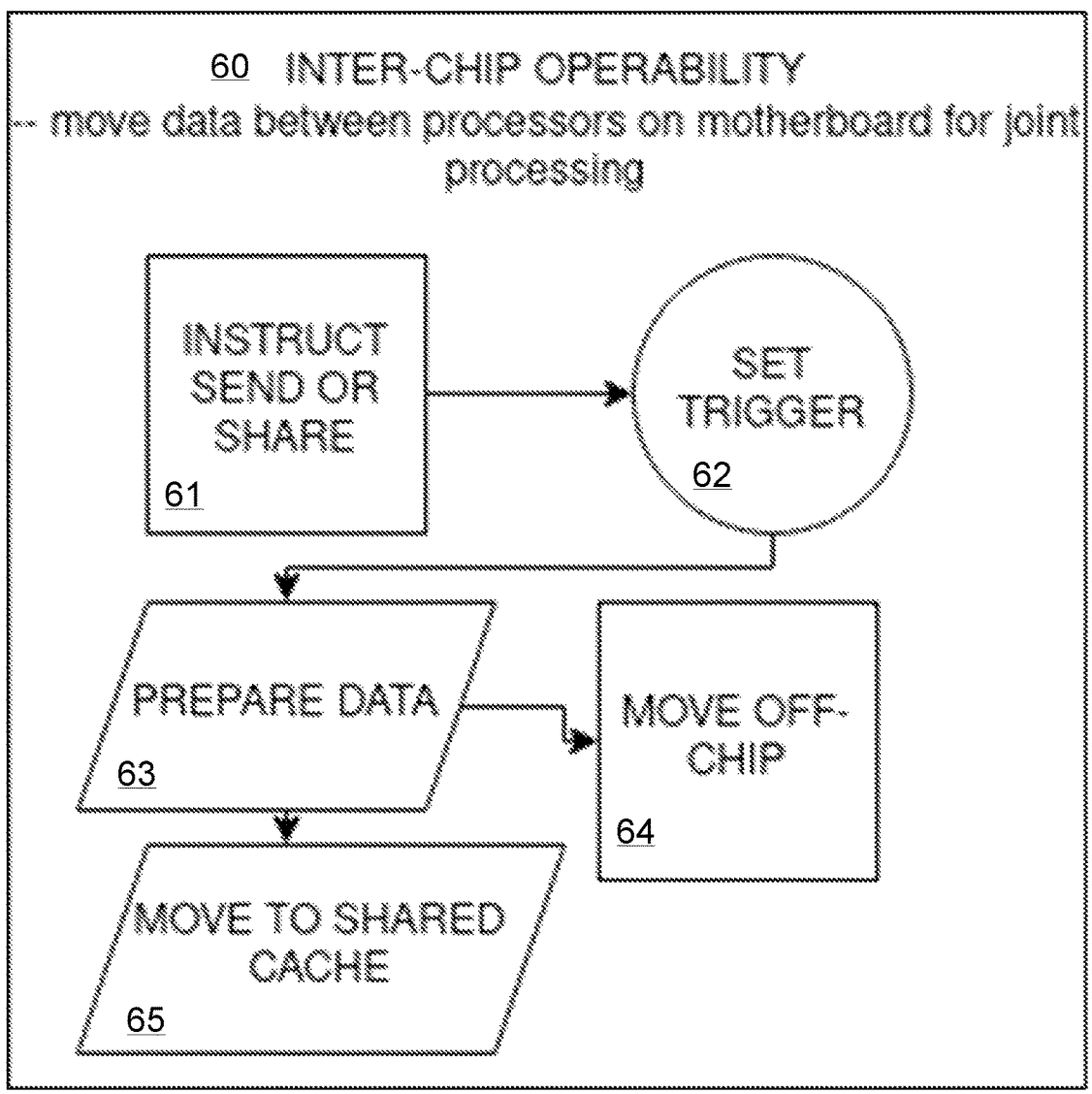
FIG. 7 depicts a flow diagram of inter-chip operability where information is jointly processed between chips.

FIG. 7 illustrates inter-chip operability (60) where information is jointly processed between processor chips and memory modules. Preferably, inter-chip operability (60) allows data to move between processors on the motherboard for joint processing after the instructed send or share (61) trigger (62) is activated. In a preferred embodiment, at any point (63) information can be jointly processed between one or more chips (64). The joint processing occurs by translocation between chips or by memory-sharing, such as with a shared cache (65), according to joint chip specifications and instruction sets.

Figure 8:
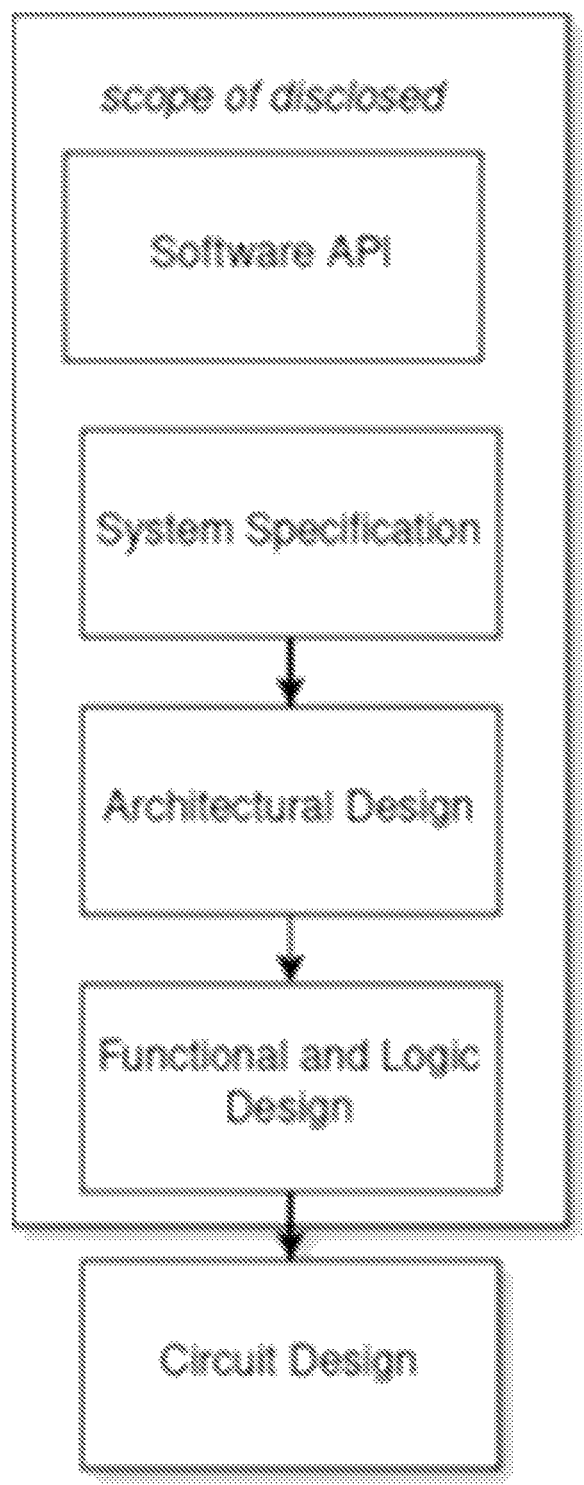
FIG. 8 depicts a flow diagram of a preferable embodiment of the present invention.

FIG. 8 illustrates the scope of a preferred embodiment of a processor chip. In a standard chip design cycle, the present invention encompasses a system specification, architectural design, function design, and logic gate design in addition to software design that may be used on a completed accelerator.

Although the method and apparatus are described above in terms of various exemplary embodiments and implementations, it should be understood that the various features, aspects, and functionality described in one or more of the individual embodiments are not limited in their applicability to the particular embodiment with which they are described, but instead might be applied, alone or in various combinations, to one or more of the other embodiments of the disclosed method and apparatus, whether or not such embodiments are described and whether or not such features are presented as being a part of a described embodiment. Thus, the breadth and scope of the claimed invention should not be limited by any of the above-described embodiments.

Terms and phrases used in this document, and variations thereof, unless otherwise expressly stated, should be construed as open-ended as opposed to limiting. As examples of the foregoing: the term "including" should be read as meaning "including, without limitation" or the like, the term "example" is used to provide exemplary instances of the item in discussion, not an exhaustive or limiting list thereof, the terms "a" or "an" should be read as meaning "at least one," "one or more," or the like, and adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that might be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to," or other like phrases in some instances shall not be read to mean that the narrower case is intended or required in instances where such broadening phrases might be absent. The use of the term "assembly" does not imply that the components or functionality described or claimed as part of the module are all configured in a common package. Indeed, any or all the various components of a module, whether control logic or other components, might be combined in a single package or separately maintained and might further be distributed across multiple locations.

Additionally, the various embodiments set forth herein are described in terms of exemplary block diagrams, flow charts, and other illustrations. As will become apparent to one of ordinary skill in the art after reading this document, the illustrated embodiments and their various alternatives might be implemented without confinement to the illustrated examples. For example, block diagrams and their accompanying description should not be construed as mandating a particular architecture or configuration.

All original claims submitted with this specification are incorporated by reference in their entirety as if fully set forth herein.

I claim:

1. An improved resource-conservative computer processor chip optimized for hypervector algebra to store, process, and losslessly retrieve information comprising:
   a process flow module;
   a hypervector data embedding module on-chip, said hypervector data embedding module further comprising
      a hypervector data embedding process which takes natural data from an external storage source and projects the natural data into fixed-point vectors in ten or less hardware registers, and
      a projection algorithm to project the natural data into fixed-point vectors while using a random number generator and XOR operations to encrypt the vectors;
   a hypervector instruction encoding module;
   a hype vector desaturation module; and,
   a hypervector decoding module that is on-chip.

2. The process flow module of claim 1, further comprising data agnostic processes of converting data to hypervectors using specialized hardware circuits.

3. Theh process flow module of claim 1, further comprising an intelligent self-activation software to monitor when data has been associated together and stored in an on-chip record.

4. The process flow module of claim 1, wherein the information gathered and associated together is large-scale in size but compressed by hypervector math form and accelerator hardware memory architecture design such that less memory is used than was used prior to said information being compressed, given the gathered information is larger in bit size than the hypervector encoding.

5. The intelligent activation software of claim 3, wherein the activation software:
   sequesters hypervectors that are active in a global memory;
   forms suggestions and generalizations of complete datasets from available partial data;
   activates sequestered hypervectors by returning them to the global memory; and,
   updates the on-chip record continuously.

6. The hypervector instruction encoding module of claim 1, further comprising a kernel which encodes binary vectors as data in parallel to fixed-point hypervectors.

7. The hypervector desaturation module of claim 1, further comprising an information desaturation process which automatically triggers during an information embedding and processing stage to check the dimensions of fixed-point vectors before removing those vectors that exceed a predefined percentage of a fixed-point vector's memory size in order to reduce vector size to a predetermined smaller state.

8. The hypervector decoding module of claim 1, further comprising a decoding hardware circuit which:
   automatically selects data vectors;
   removes selected data vectors to a memory cache; and,
   decodes selected data vectors into binary vectors.

9. The improved processor chip of claim 1, wherein the processor chip processes compressed information jointly with one or more other processor chips in hypervector form.

10. The system of claim 1, wherein the process flow module uses an output-type instance to classify specific encoding and decoding protocols related to information loss such that the protocols are to be used by the improved computer processing chip before deploying the embedding module.

11. The system of claim 1, wherein the information embedding module stores on-chip data that has been transformed from off-chip data through an information embedding process which takes natural data and projects the natural data into an algebraic form of a hypervector, binary, fixed-point vectors held entirely in ten or less registers.

12. An improved resource-conservative computer processor chip optimized for hypervector algebra to store, process, and losslessly retrieve information comprising:
 a process flow module;
 a hypervector data embedding module on-chip;
 a hypervector instruction encoding module;
 a hype vector desaturation module;
 a hypervector decoding module that is on-chip
 wherein the processor chip uses a compiler with special logic gate operations to compute regular information processing instructions to hypervector processing instructions;
 wherein the information embedding process uses a projection algorithm to encrypt the fixed-point vectors through a random hypervector by a series of xor, consensus sum, and statistical probability calculations.

13. The system of claim 1, further comprising an information embedding and processing stage where the on-chip information desaturation module automatically triggers to check the dimensions of fixed-point vectors before removing components of the vectors which have become too large to reduce vector dimension values to a predetermined state.

14. The system of claim 11, further comprising an information activation software which extracts special associative properties of fixed-point vectors to create suggestions from data subsets during an information processing stage.

15. The system of claim 1, wherein the on-chip decoding module uses an on-chip decoding algorithm to reassemble hypervector fixed-point vectors into binary vectors of original data form with acceptable loss to complete data transfer off-chip.

* * * * *